(12) United States Patent
Koste et al.

(10) Patent No.: US 8,005,617 B2
(45) Date of Patent: Aug. 23, 2011

(54) SYSTEM AND METHOD FOR DETECTING LIGHTNING STRIKES LIKELY TO AFFECT A CONDITION OF A STRUCTURE

(75) Inventors: Glen Peter Koste, Niskayuna, NY (US); Gerald Curtin, Niskayuna, NY (US); Yaru Mendez Hernandez, Bavaria (DE); Richard Hardison, Greenville, SC (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/955,325

(22) Filed: Nov. 29, 2010

(65) Prior Publication Data

US 2011/0118982 A1    May 19, 2011

(51) Int. Cl.
*G01W 1/16* (2006.01)
*G01W 1/00* (2006.01)
*G06F 19/00* (2006.01)
*G06F 17/40* (2006.01)

(52) U.S. Cl. .......... 702/4; 73/170.24; 324/72; 340/601; 340/679; 340/870.07; 340/870.16; 416/16; 702/34; 702/64; 702/187; 702/189

(58) Field of Classification Search .............. 73/147, 73/170.16, 170.24, 432.1, 865.8; 324/72, 324/72.5; 340/500, 540, 580, 601, 657, 659, 340/679, 870.01, 870.07, 870.16, 945, 984; 416/61; 702/1, 2, 3, 4, 33, 34, 57, 60, 64, 702/66, 127, 182, 183, 187, 188, 189
See application file for complete search history.

(56) References Cited

U.S. PATENT DOCUMENTS

| 3,121,196 | A | * | 2/1964 | Kasemir | 324/464 |
|---|---|---|---|---|---|
| 3,772,594 | A | * | 11/1973 | Kuehnast | 324/72 |
| 4,543,580 | A | * | 9/1985 | Bent et al. | 342/460 |
| 4,792,806 | A | * | 12/1988 | Bent et al. | 342/465 |
| 4,914,444 | A | * | 4/1990 | Pifer et al. | 342/460 |
| 5,036,334 | A | * | 7/1991 | Henderson et al. | 342/460 |
| 5,184,215 | A | * | 2/1993 | Barker | 348/159 |
| 5,699,245 | A | * | 12/1997 | Herold | 702/4 |
| 5,771,020 | A | * | 6/1998 | Markson et al. | 342/460 |
| 6,064,340 | A | * | 5/2000 | Croft et al. | 342/460 |

(Continued)

OTHER PUBLICATIONS

Kramer et al., "Experimental Setup for Lightning Current Measurement and Impact Localization Based on Fiber Optic Current Sensors", In Proceedings of the International Conference on Lightning and Static Electricity, pp. 28-31, Aug. 2007, Paris, France.

(Continued)

*Primary Examiner* — Edward Cosimano
(74) *Attorney, Agent, or Firm* — Ann M. Agosti

(57) ABSTRACT

A lightning detection system and method for detecting a lightning strike are provided. The system includes a lightning detector in a structure susceptible to a lightning strike. The lightning detector includes a data logger configured to log data indicative of a time of occurrence of the lightning strike. The system further includes memory to store data collected from a wide-area lightning detection network. The stored data includes at least one characteristic of the lightning strike. A processor may be configured to process data from the data logger relative to data collected from the wide-area lightning detection network to determine correlated data indicative of a lightning strike affecting the structure. In the event correlated data is determined, the processor may be configured to assign the characteristic of the lightning strike to the structure.

20 Claims, 4 Drawing Sheets

U.S. PATENT DOCUMENTS

| | | | |
|---|---|---|---|
| 6,420,862 B2* | 7/2002 | Medelius et al. | 324/72 |
| 6,552,521 B1* | 4/2003 | Medelius et al. | 324/72 |
| 6,741,069 B1 | 5/2004 | Klemar et al. | |
| 6,768,946 B2* | 7/2004 | Okabe et al. | 702/4 |
| 6,788,043 B2* | 9/2004 | Murphy et al. | 324/72 |
| 6,791,311 B2* | 9/2004 | Murphy et al. | 324/72 |
| 7,016,785 B2* | 3/2006 | Makela et al. | 702/4 |
| 7,400,054 B2 | 7/2008 | Wesselink | |
| 7,468,505 B2 | 12/2008 | Kraemeru | |
| 7,508,186 B2 | 3/2009 | Mortensen | |
| 7,672,783 B2* | 3/2010 | Oettinger | 702/4 |
| 7,806,657 B2 | 10/2010 | Schram et al. | |
| 2003/0151397 A1* | 8/2003 | Murphy et al. | 324/72 |
| 2003/0151398 A1* | 8/2003 | Murphy et al. | 324/72 |
| 2003/0187580 A1* | 10/2003 | Okabe et al. | 702/4 |
| 2005/0197776 A1* | 9/2005 | Makela et al. | 702/4 |
| 2006/0126252 A1* | 6/2006 | Mortensen | 361/118 |
| 2007/0041834 A1* | 2/2007 | Schram et al. | 416/61 |
| 2007/0156339 A1* | 7/2007 | Oettinger | 702/4 |
| 2008/0262732 A1* | 10/2008 | Davis et al. | 702/4 |
| 2009/0281730 A1* | 11/2009 | Said et al. | 702/4 |
| 2009/0295587 A1* | 12/2009 | Gorman, Jr. | 340/601 |
| 2010/0077850 A1* | 4/2010 | Matsushita | 73/170.24 |

OTHER PUBLICATIONS

Kramer et al., "Fiber Optic Sensor Network for Lightning Impact Localization and Classification in Wind Turbines", IEEE International Conference on Multisensor Fusion and Integration for Intelligent Systems, pp. 173-178, Sep. 2006, Heidelberg.

* cited by examiner

SYSTEM AND METHOD FOR DETECTING LIGHTNING STRIKES LIKELY TO AFFECT A CONDITION OF A STRUCTURE

BACKGROUND

The present invention is generally related to lightning detection for structures susceptible to lightning strikes, and more particularly, to a system and lightning detection techniques that may be configured to estimate a condition of the structure due to a lightning strike.

Various structures, such as wind turbines, aircrafts, marine structures, tall structures, etc., may be exposed to lightning strikes. For example, wind turbine blades have become increasingly susceptible to lightning strikes, as the dimensions of the wind turbine blades have increased. The condition of a wind turbine blade exposed to a lightning strike can be adversely affected. This can result in reduced productivity since a relatively long period of down-time may be needed to inspect and then repair and/or replace an affected blade or component.

It is known that various types of lightning detection systems have been proposed to locally detect a lightning strike affecting a given structure. The basic approach is to install such a system onboard a given structure to gain sufficient information to estimate a condition of the structure due to the lightning strike. That is, such systems tend to be technically complex and thus costly since they must be built with a sufficiently high-degree of technical sophistication to ensure that the information needed to estimate the condition of the structure is accurately and reliably obtained to reduce the occurrence of incorrect estimates of the condition of the structure due to the lightning strike and the electromagnetic interference associated to it.

In view of the foregoing considerations, there is a need to provide an improved lightning detection system and/or techniques that may be conducive to simplifying the technical complexity of the lightning detection equipment onboard the structure and thus alleviate the relatively high-costs generally associated with such complex systems. This need should be met without compromising the accuracy and reliability of the information used to estimate the condition of the structure due to the lightning strike and its associated electromagnetic effects.

BRIEF DESCRIPTION

In one example embodiment a lightning detection system is provided. The system includes a lightning detector in a structure susceptible to a lightning strike. The lightning detector includes a data logger configured to log data indicative of a time of occurrence of the lightning strike. The system further includes memory for storing data collected from a wide-area lightning detection network. The stored data includes at least one characteristic of the lightning strike. A processor may be configured to process data from the data logger relative to data collected from the wide-area lightning detection network to determine correlated data indicative of a lightning strike affecting the structure. In the event correlated data is determined, the processor may be configured to assign the characteristic of the lightning strike to the structure.

In accordance with further aspects of the invention, a wind park may comprise a plurality of wind turbines. The wind park may comprise a lightning detection system configured to detect a lightning strike affecting at least one blade of at least one of the wind turbines. The system may include a respective lightning detector coupled to a respective blade of a respective wind turbine. The respective lightning detector may include a data logger configured to log data indicative of a time of occurrence of the lightning strike, and an identifier of the respective wind turbine blade in the respective wind turbine. The system may further include memory for storing data collected from a wide-area lightning detection network. The stored data includes at least one characteristic of the lightning strike and an estimated location of the lightning strike. A processor may be configured to process data from each respective data logger relative to data collected from the wide-area lightning detection network to determine temporally and spatially correlated data indicative of a lightning strike affecting one or more of the wind turbines. In the event temporally and spatially correlated data is determined, the processor may be configured to assign the characteristic of the lightning strike to one or more of the blades of a wind turbine.

In yet another aspect of the present invention a method for detecting a lightning strike is provided. The method may include the following steps: arranging a lightning detector in a structure susceptible to a lightning strike, the lightning detector includes a data logger; collecting data from the data logger, the data may include a time of occurrence of the lightning strike, and an identifier of the structure; collecting data from a wide-area lightning detection network, the collected data from the network includes at least one characteristic of the lightning strike; processing data collected from the data logger relative to data collected from the wide-area lightning detection network to determine temporally and spatially correlated data indicative of a lightning strike affecting the structure; and, when correlated data indicative of the lightning strike affecting the structure is determined, assigning the characteristic of the lightning strike to the structure.

DRAWINGS

These and other features, aspects, and advantages of the present invention will become better understood when the following detailed description is read with reference to the accompanying drawings in which like characters represent like parts throughout the drawings, wherein.

Figure 4:
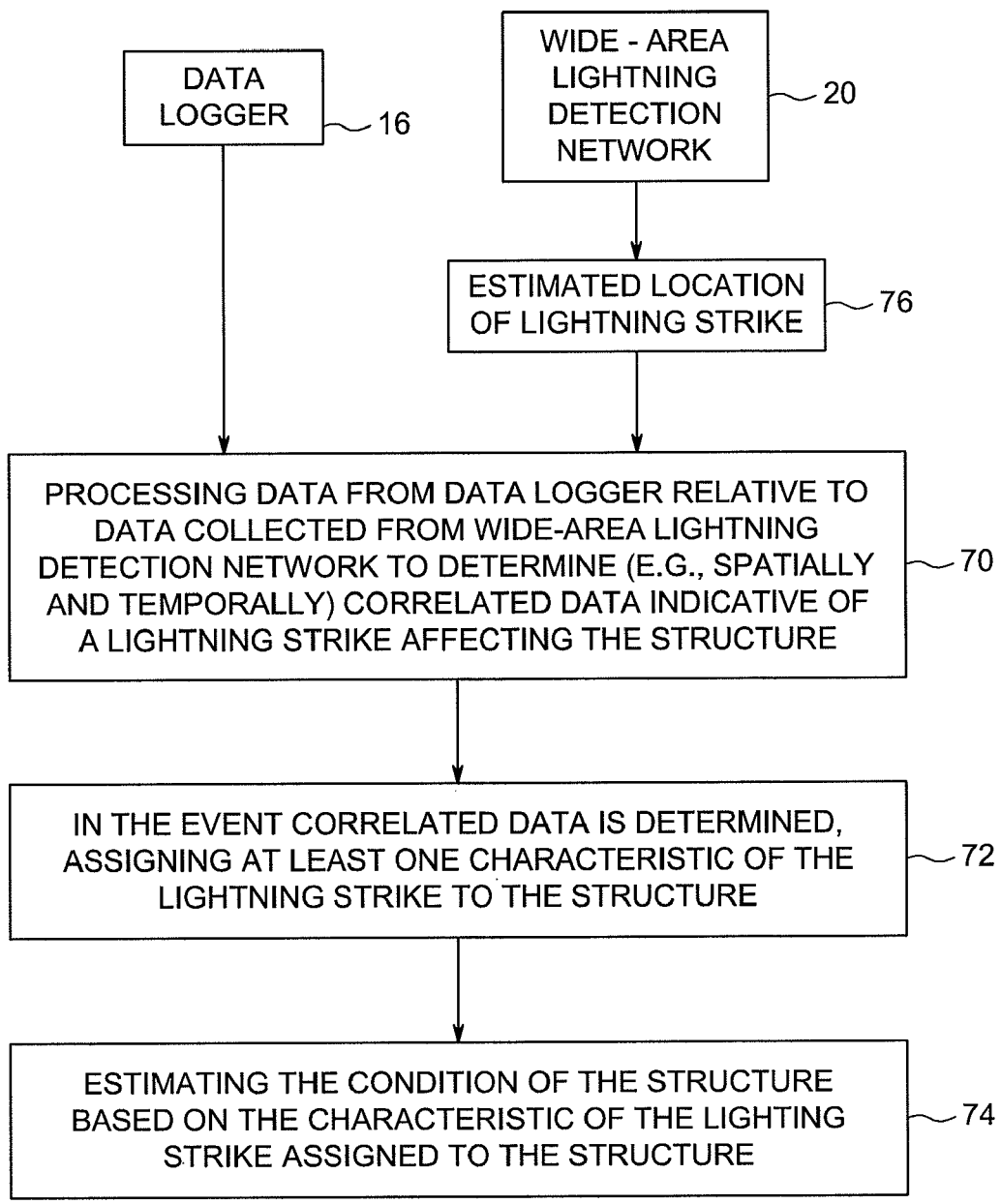

FIG. 4 in part contains a flow chart of example processing actions as may be performed by a processor configured in accordance with aspects of the present invention.

DETAILED DESCRIPTION

Use of wide-area lightning detector networks or lightning location systems (LLS) has been generally confined to meteorological services like the National Weather Service in the United States, or use by organizations like electrical utilities, air traffic controllers, forest fire prevention services, etc., where acquisition of lightning information over a relatively large area may be useful. Such networks can provide valuable information in connection with the characteristics of a lightning strike but may not have the localization accuracy that may be needed to associate a given structure with a lightning strike. For example, a probability ellipse of confidence for the lightning location may be in the order of approximately 500 m and this may not be enough to determine whether a given structure was actually affected by a lightning strike.

The inventors of the present invention propose an elegant approach that synergistically combines information acquired from a wide-area lightning detector network with information acquired from a local lightning detection system. This approach may advantageously allow simplifying the complexity of the lightning detection equipment onboard the structure without compromising the accuracy and reliability of the information used to estimate the condition of the structure due to the lightning strike.

Figure 1:
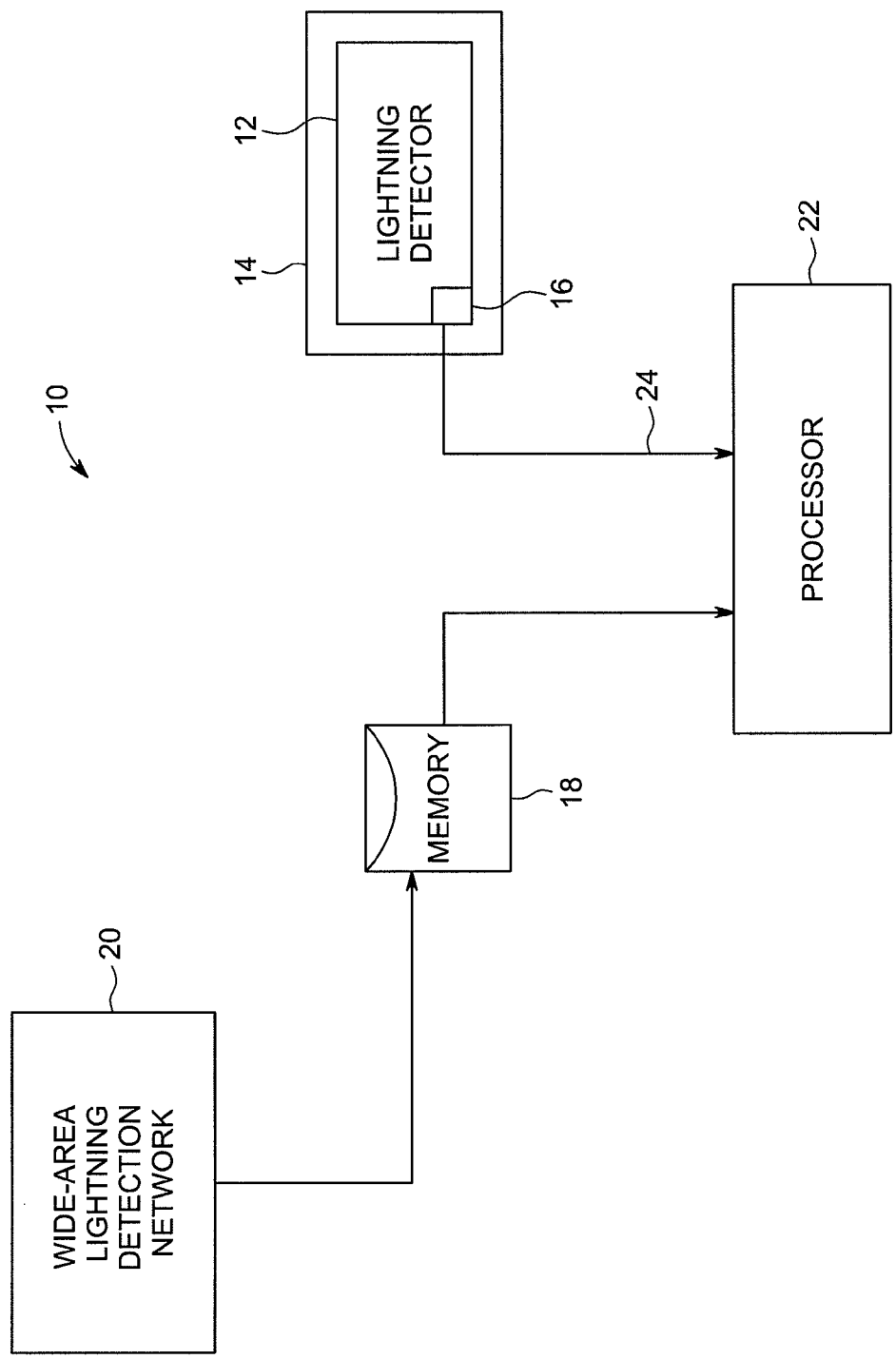
FIG. 1 is block diagram of an example embodiment of a lightning detection system embodying aspects of the present invention, as may involve a combination of data from a wide-area lightning detector network and data from a local lightning detector in a structure susceptible to a lightning strike.

FIG. 1 is block diagram of an example embodiment of a lightning detection system 10 embodying aspects of the present invention. Lightning detection system 10 may include a lightning detector 12 disposed in a structure 14 susceptible to a lightning strike. That is, lightning detector 12 may be viewed as a local detector relative to structure 14. Examples of structure 14 may be wind turbines, aircrafts, marine structures, tall structures, etc. Lightning detector 12 may include a data logger 16 configured to log data indicative of a time of occurrence of the lightning strike. System 10 may further include a memory 18 for storing data collected from a wide-area lightning detection network 20 or LLS. In one example embodiment, a transceiver may be used to provide bi-directional communication means if so desired.

It will be appreciated that aspects of the present invention are not limited to data from any given wide-area lightning detection network or LLS. Accordingly, the examples provided below should be construed in an example sense and not in a limiting sense. Examples of wide-area lightning detection networks that may be used, singly or in combination depending on the needs of a given application and/or on the required geographical coverage, may be the North American Lightning Detection Network (NALDN), the North American Precision Lightning Network (NALDN), the European Cooperation For Lightning Detection (EUCLID) network, the Lightning Detection Network (LINET), based in Europe for example.

The data collected from wide-area lightning detection network 20 (e.g., data stored in memory 18) may include at least one characteristic of the lightning strike. Examples of the characteristic of the lightning strike may be: polarity of the lightning strike, peak current resulting from the lightning strike, an amount of electrical specific energy resulting from the lightning strike, an amount of electrical transferred charge resulting from the lightning strike, lightning strike type, such as a ground-to-cloud lightning strike or a cloud-to-cloud lightning strike, or a combination of two or more of the foregoing characteristics. The data collected from wide-area lightning detection network 20 may further include an estimated location of the lightning strike.

In one example embodiment, data logger 16 may be configured to provide a timestamp 24 indicative of the time of occurrence of the lightning strike and an identifier of the structure, such as may allow identifying a respective wind turbine in a wind park and/or identify a respective blade of a wind turbine.

A processor 22 is configured to process data from data logger 16 relative to data collected from the wide-area lightning detection network to determine correlated data indicative of a lightning strike affecting the structure. In the event correlated data is determined, processor 22 may be configured to assign (e.g., associate) the one or more characteristics of the lightning strike to the structure. This allows estimating a condition of the structure due to the lightning strike. The correlated data indicative of the lightning strike affecting the structure may comprise spatially and temporally (e.g., time-domain) correlated data.

For example, data from wide-area lightning detection network 20 may indicate occurrence of a lightning strike proximate a given structure 14, such as within the ellipse of confidence for the lightning location, and this may not be enough by itself to determine whether structure 14 was actually affected by the lightning strike. However, as noted above, in the event a lightning strike actually affects structure 24, timestamp 24 from data logger 16 would be generated, and this timestamp would contain data indicative of the time of occurrence of the lightning strike and in combination with the identifier of the structure would allow determining spatially and temporally correlated data from lightning detection network 20 and from detector 12. That is, the correlated data would indicate that the lightning strike actually affected structure 24. When correlated data is determined, processor 22 may be configured to assign the one or more characteristics of the lightning strike to the structure. This allows estimating the condition of the structure based on the one or more characteristics characteristic of the lightning strike assigned to the structure, (e.g., peak current, amount of electrical specific energy, etc).

Figure 2:
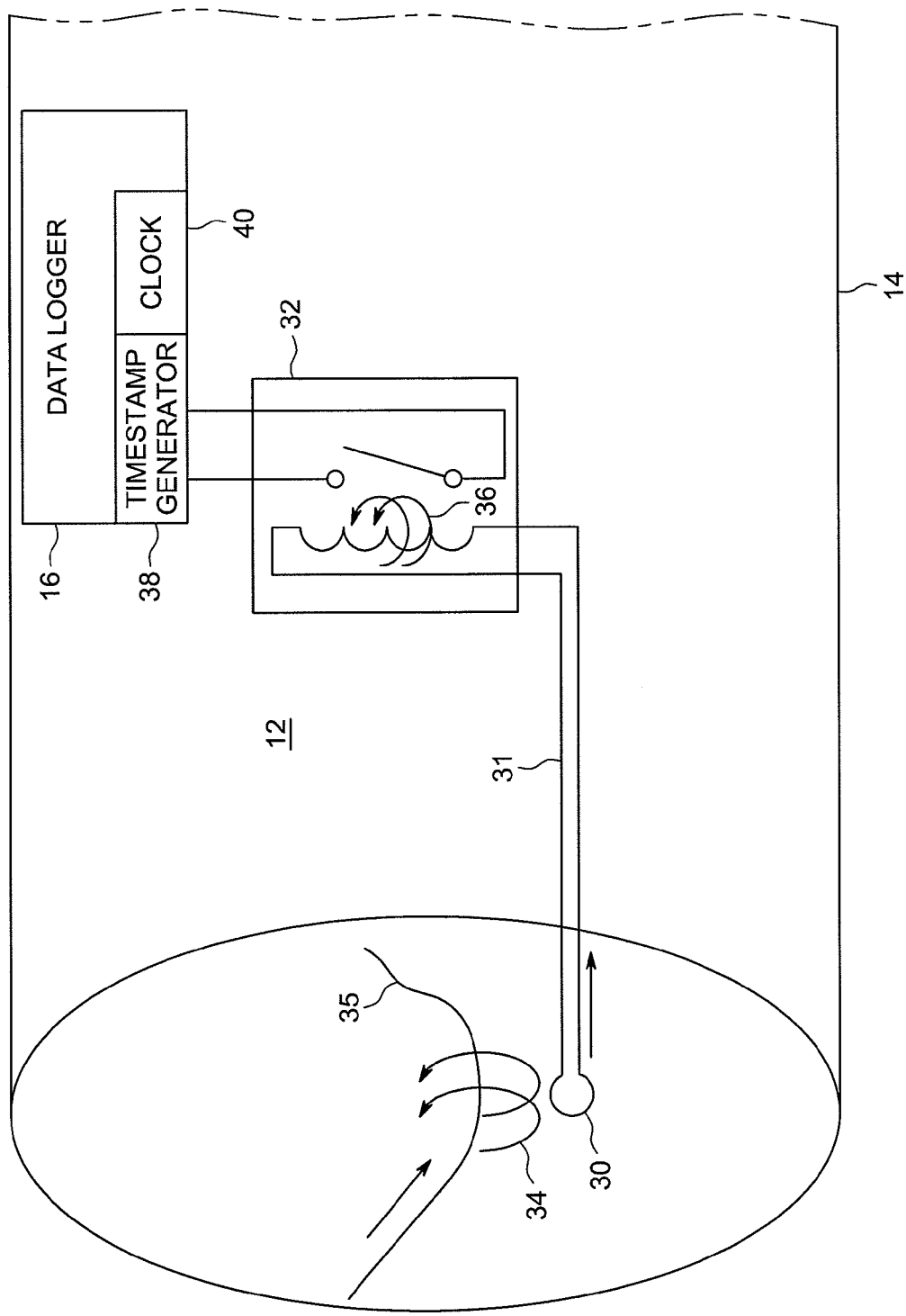
FIG. 2 is a schematic representation of one example embodiment of a lightning detector in the structure susceptible to the lightning strike. The lightning detector is an example component of the lightning detection system shown in FIG. 1.

FIG. 2 is a schematic of one example embodiment of lightning detector 12 in a structure 14 susceptible to a lightning strike. An electromagnetic coil 30 may be electrically coupled through an electrical conductor 31 (e.g., twisted pair) to a relay 32. Coil 30 may be responsive to an electromagnetic field 34 induced by a lightning current 35 resulting from the lightning strike to generate a relay actuation signal 36. Data logger 16 may include a timestamp generator 38 coupled to a real-time clock 40. Timestamp generator 38 may be responsive to an actuation of the relay (e.g., closed condition of relay 32) by the relay actuation signal to generate the timestamp indicative of the time of occurrence of the lightning strike. For example, clock 40 may be synchronized relative to GPS time or may be synchronized relative to time signals from radio station services, as would be readily understood by one skilled in the art.

It should be appreciated from the foregoing example description, the relatively straightforward implementation of a lightning detector that can be synergistically combined with data from a wide-area lightning detection network in accordance with aspects of the present invention. That is, a relatively low-cost onboard detector with data services from a wide-area lightning detection network can be designed to reliably and accurately meet lightning detection in the structure. It is noted that aspects of the present invention are not limited to the example detector shown in FIG. 2. For example, one could use the combination of data from a wide-area lightning detection network with data from essentially any onboard lightning detector configured to trigger the time stamp generator when the lightning strike occurs. Thus, it should be appreciated that detector 12 is not limited to any specific modality for triggering the time stamp generator since one skilled in the art would appreciate that the functionality provided by detector 12 may be provided by alternative modalities, such as may involve electro-optical components to avoid malfunctioning due to electromagnetic interference.

Figure 3:
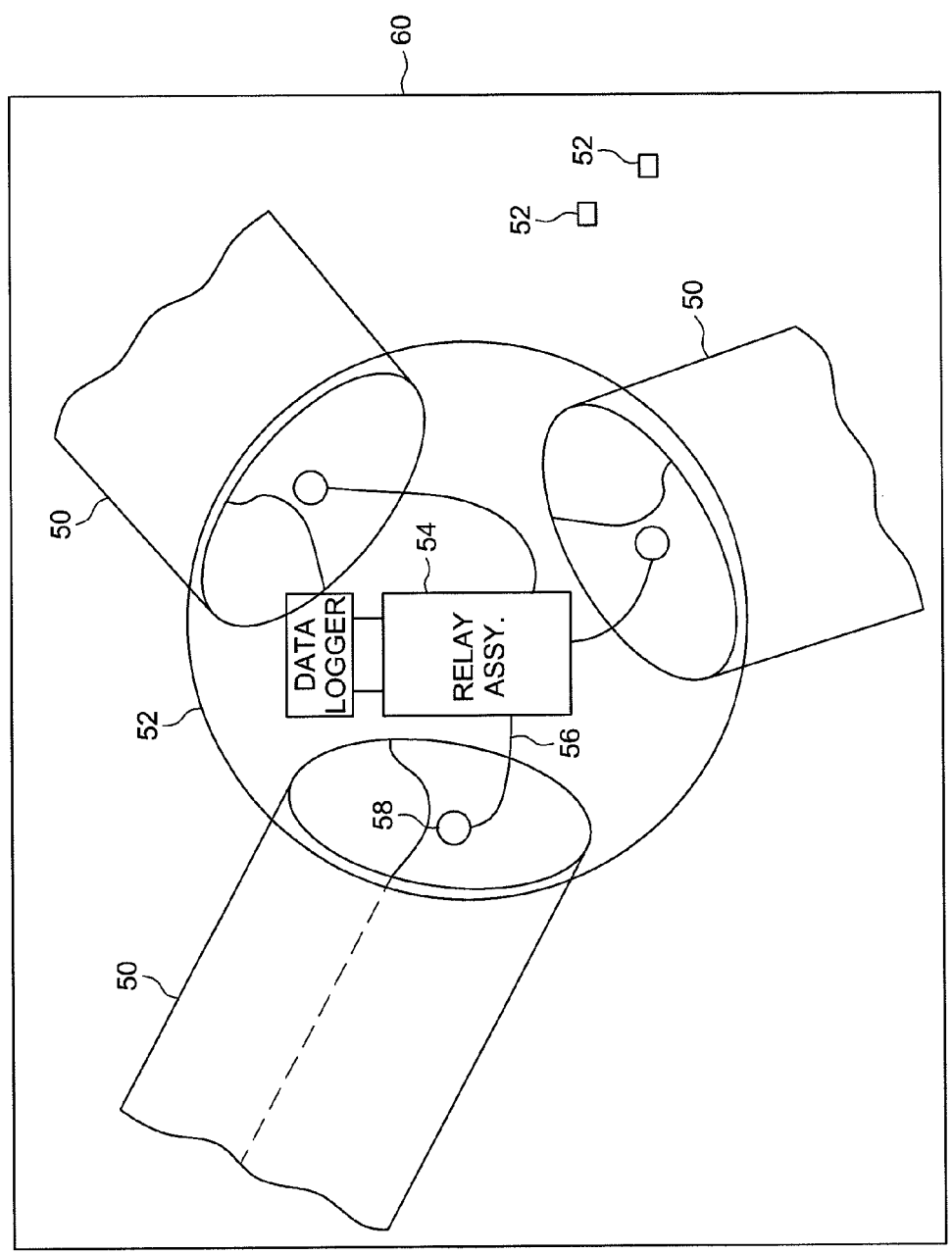
FIG. 3 is a schematic representation of an example arrangement of respective lightning detectors as may be disposed in each blade of a wind turbine.

FIG. 3 is a schematic representation of an example embodiment where a respective local lightning detector is coupled to each respective blade 50 of a wind turbine 52. In this example embodiment, a relay assembly 54 may be configured to receive by way of a respective conductor 56 a respective electrical current induced in a respective coil 58 in response to lightning current resulting from the lightning strike to generate a respective relay actuation signal. This arrangement would indicate which of the respective blades 50 has been affected by the lightning strike. It will be appreciated that one need not include a respective lightning detector for each blade. For example, a single lightning detector could be installed in a nacelle region of the wind turbine to detect a strike on the wind turbine. In this case, one would not be able to determine which specific blade of the turbine was struck and thus one should perform individual inspection of each of such blades.

It will be appreciated that aspects of the present invention may be conveniently used in a wind park 60 made up of a plurality of wind turbines 52, where a lightning detection system embodying aspects of the present invention may be configured to detect a lightning strike affecting at least one blade in at least one of the wind turbines of the wind park. A wind park operation center may collect data from the respective data loggers of the plurality of wind turbines to process such data relative to data collected from the wide-area lightning detection network, as described above.

FIG. 3 contains a flow chart of example processing actions as may be performed by processor 22 (FIG. 1). Block 70 indicates processing data from data logger 16 relative to data collected from wide-area lightning detection network 20 to determine (e.g., spatially and temporally) correlated data indicative of a lightning strike affecting the structure. In the event correlated data is determined, block 72 indicates assigning at least one characteristic of the lightning strike to the structure. Block 74 indicates estimating the condition of the structure based on the characteristic of the lightning strike assigned to the structure. In one example embodiment, as indicated by block 76, the data collected from wide-area lightning detection network may include an estimated location of the lightning strike.

In operation, a lightning detection system embodying aspects of the present invention is useful to perform targeted inspection, such as when a detrimental condition of the structure is most likely to have occurred and therefore is conducive to improving economic productivity. Additionally, a lightning detection system embodying aspects of the present invention is conducive to reducing incorrect estimates regarding the condition of the structure.

FIG. 4 contains a flow chart of example processing actions as may be performed by processor 22 (FIG. 1). Block 70 indicates processing data from data logger 16 relative to data collected from wide-area lightning detection network 20 to determine (e.g., spatially and temporally) correlated data indicative of a lightning strike affecting the structure. In the event correlated data is determined, block 72 indicates assigning at least one characteristic of the lightning strike to the structure. Block 74 indicates estimating the condition of the structure based on the characteristic of the lightning strike assigned to the structure. In one example embodiment, as indicated by block 76, the data collected from wide-area lightning detection network may include an estimated location of the lightning strike.

While only certain features of the invention have been illustrated and described herein, many modifications and changes will occur to those skilled in the art. It is, therefore, to be understood that the appended claims are intended to cover all such modifications and changes as fall within the true spirit of the invention.

We claim:

1. A lightning detection system comprising:
a lightning detector in a structure susceptible to a lightning strike, said lightning detector comprising a data logger configured to log data indicative of a time of occurrence of the lightning strike;
memory for storing data collected from a wide-area lightning detection network, the stored data including at least one characteristic of the lightning strike; and
a processor configured to process data from said data logger relative to data collected from the wide-area lightning detection network to determine correlated data indicative of a lightning strike affecting the structure, wherein, in the event correlated data is determined, said processor is configured to assign said at least one characteristic of the lightning strike to the structure.

2. The system of claim 1, wherein said processor is configured to estimate the condition of the structure based on said at least one characteristic of the lightning strike assigned to the structure.

3. The system of claim 1, wherein said structure is one of a wind turbine, a wind turbine blade, an aircraft structure and a marine structure.

4. The system of claim 1, wherein said at least one characteristic of the lightning strike is selected from the group consisting of a polarity of the lightning strike, a peak current resulting from the lightning strike, an amount of electrical specific energy resulting from the lightning strike, an amount of electrical transferred charge resulting from the lightning strike, a lightning strike type comprising one of a ground-to-cloud lightning strike and a cloud-to-cloud lightning strike and a combination of at least two of said characteristics of the lightning strike.

5. The system of claim 1, wherein the structure comprises a plurality of wind turbine blades of a wind turbine, wherein at least one of the turbine blades is susceptible to the lightning strike, each turbine blade having a respective lightning detector and data logger, the processor configured to process data from each respective data logger relative to data collected from the wide-area lightning detection network to determine correlated data indicative of a lightning strike affecting said at least one of the turbine blades, wherein, in the event correlated data is determined, said processor is configured to assign said at least one characteristic of the lightning strike to said at least one blade of the wind turbine.

6. The system of claim 1, wherein data from the data logger includes a timestamp indicative of the time of occurrence of the lightning strike and an identifier of the structure.

7. The system of claim 6, wherein data collected from the wide-area lightning detection network includes an estimated location of the lightning strike.

8. The system of claim 7, wherein correlated data indicative of the lightning strike affecting the structure comprises spatially and temporally correlated data.

9. The system of claim 1, wherein said lightning detector comprises an electrical conductor electrically coupled to a relay, wherein the electrical conductor is responsive to a lightning current resulting from the lightning strike to generate a relay actuation signal.

10. The system of claim 9, wherein said lightning detector further comprises a timestamp generator responsive to an actuation of the relay by the relay actuation signal to generate the timestamp indicative of the time of occurrence of the lightning strike.

11. The system of claim 10, wherein said timestamp generator is synchronized relative to a global positioning system (GPS) time.

12. A wind park comprising a plurality of wind turbines, the wind park comprising a lightning detection system configured to detect a lightning strike affecting at least one blade of at least one of the wind turbines, the system comprising:
- a respective lightning detector coupled to a respective blade of a respective wind turbine, the respective lightning detector comprising a data logger configured to log data indicative of a time of occurrence of the lightning strike, and an identifier of the respective wind turbine blade in the respective wind turbine;
- memory for storing data collected from a wide-area lightning detection network, the stored data including at least one characteristic of the lightning strike and an estimated location of the lightning strike; and
- a processor configured to process data from each respective data logger relative to data collected from the wide-area lightning detection network to determine temporally and spatially correlated data indicative of a lightning strike affecting said at least one of the wind turbines, wherein, in the event said temporally and spatially correlated data is determined, said processor is configured to assign said at least one characteristic of the lightning strike to said at least one blade of said at least one of the wind turbines.

13. The system of claim 12, wherein said processor is configured to estimate the condition of said at least one blade in said at least one of the wind turbines based on said at least one characteristic of the lightning strike assigned to said at least one blade.

14. The system of claim 12, wherein said at least one characteristic of the lightning strike is selected from the group consisting of a polarity of the lightning strike, a peak current resulting from the lightning strike, an amount of electrical specific energy resulting from the lightning strike, an amount of electrical transferred charge resulting from the lightning strike, a lightning strike type comprising one of a ground-to-cloud lightning strike and a cloud-to-cloud lightning strike and a combination of at least two of said characteristics of the lightning strike.

15. A method for detecting a lightning strike comprising:
- arranging a lightning detector in a structure susceptible to a lightning strike, wherein the lightning detector includes a data logger;
- collecting data from the data logger, said data including a time of occurrence of the lightning strike, and an identifier of the structure;
- collecting data from a wide-area lightning detection network, the collected data from the network including at least one characteristic of the lightning strike;
- processing data collected from the data logger relative to data collected from the wide-area lightning detection network to determine temporally and spatially correlated data indicative of a lightning strike affecting the structure; and
- when correlated data indicative of the lightning strike affecting the structure is determined, assigning said at least one characteristic of the lightning strike to the structure.

16. The method of claim 15, wherein said at least one characteristic of the lightning strike is selected from the group consisting of a polarity of the lightning strike, a peak current resulting from the lightning strike, an amount of electrical specific energy resulting from the lightning strike, an amount of electrical transferred charge resulting from the lightning strike, a lightning strike type comprising one of a ground-to-cloud lightning strike and a cloud-to-cloud lightning strike and a combination of at least two of said characteristics of the lightning strike.

17. The method of claim 15, wherein the arranging of the lightning detector comprises coupling an electrical conductor to a relay, wherein the electrical conductor is responsive to a lightning current resulting from the lightning strike to generate a relay actuation signal.

18. The method of claim 17, further comprising generating a time stamp indicative of the time of occurrence of the lightning strike in response to an actuation of the relay by the relay actuation signal.

19. The method of claim 15, wherein the structure comprises a plurality of wind turbine blades of a wind turbine, wherein the lightning strike affects at least one of the turbine blades, and wherein the method further comprises:
- disposing in each turbine blade a respective lightning detector and data logger;
- configuring the processor to process data from each respective data logger relative to data collected from the wide-area lightning detection network to determine temporally and spatially correlated data indicative of a lightning strike affecting said at least one of the turbine blades; and
- in the event said temporally and spatially correlated data is determined, said processor is configured to assign said at least one characteristic of the lightning strike to said at least one of the turbine blades.

20. The method of claim 19, further comprising estimating the condition of said at least one blade based on said at least one characteristic of the lightning strike assigned to said at least one blade.

* * * * *

UNITED STATES PATENT AND TRADEMARK OFFICE
CERTIFICATE OF CORRECTION

| | |
|---|---|
| PATENT NO. | : 8,005,617 B2 |
| APPLICATION NO. | : 12/955325 |
| DATED | : August 23, 2011 |
| INVENTOR(S) | : Koste et al. |

It is certified that error appears in the above-identified patent and that said Letters Patent is hereby corrected as shown below:

In Column 3, Line 42, delete "(NALDN)," and insert -- (NAPLN), --, therefor.

In Column 5, Lines 26-39, delete "FIG. 3 contains a.....................lightning strike.".

Signed and Sealed this
Eighth Day of November, 2011

David J. Kappos
*Director of the United States Patent and Trademark Office*